United States Patent [19]

Leland

[11] Patent Number: 5,544,696

[45] Date of Patent: Aug. 13, 1996

[54] ENHANCED NUCLEATE BOILING HEAT TRANSFER FOR ELECTRONIC COOLING AND THERMAL ENERGY TRANSFER

[75] Inventor: John E. Leland, Beavercreek, Ohio

[73] Assignee: The United States of America as represented by the Secretary of the Air Force, Washington, D.C.

[21] Appl. No.: 269,738

[22] Filed: Jul. 1, 1994

[51] Int. Cl.⁶ .................................................. F28F 13/02
[52] U.S. Cl. .......................... 165/80.4; 165/911; 361/700
[58] Field of Search .............................. 165/1, 80.4, 135, 165/911; 361/700

[56] References Cited

U.S. PATENT DOCUMENTS

| | | | |
|---|---|---|---|
| 3,613,779 | 10/1971 | Brown | 165/133 |
| 4,050,507 | 9/1977 | Chu et al. | 165/1 |
| 4,949,164 | 8/1990 | Ohashi et al. | 361/700 X |
| 4,999,741 | 3/1991 | Tyler | 361/387 |
| 5,021,924 | 6/1991 | Kieda et al. | 361/700 X |
| 5,077,601 | 12/1991 | Hatada et al. | 357/81 |
| 5,099,908 | 3/1992 | Taraci et al. | 165/1 |
| 5,158,136 | 10/1992 | Azar | 165/185 |
| 5,349,499 | 9/1994 | Yamada et al. | 361/700 |

*Primary Examiner*—Allen J. Flanigan
*Attorney, Agent, or Firm*—Gerald B. Hollins; Thomas L. Kundert

[57] ABSTRACT

A micro consideration of the phase change or boiling cooling of an electronic part is disclosed including focus on a heat exchanging problem that is encountered in the use of this phase change cooling in the presence of realistic flow rates and energy dissipations. The combination of coolant flow and projection of the cooled part into the coolant stream flow is shown to result in difficulties that make such cooling less desirable for electronic and other purposes without use of improvement such as, is achieved in the present invention. Preclusion of these difficulties (involving coolant vapor) by the addition of a small geometric shape or other vapor-considered alterations of the cooled part environment are also disclosed. Results of the achieved improved cooling are shown in graphic relationships. The disclosed invention is couched in terms of electronic part cooling but is applicable to a variety of other heat exchange situations.

20 Claims, 8 Drawing Sheets

ENHANCED NUCLEATE BOILING HEAT TRANSFER FOR ELECTRONIC COOLING AND THERMAL ENERGY TRANSFER

RIGHTS OF THE GOVERNMENT

The invention described herein may be manufactured and used by or for the Government of the United States for all governmental purposes without the payment of any royalty.

BACKGROUND OF THE INVENTION

This invention relates to the field of heat transfer to a moving fluid and the optimization of this transfer in the presence of nucleate boiling.

The relatively large quantities of heat transfer achievable through use of the heat of vaporization of liquids is attractive for cooling electronic parts as well as for other heat transfer purposes. The use of this heat transfer mechanism in the steam heating of buildings and for industrial purposes is a common example of the large and effective application of this heat transfer mechanism in everyday life. The boiling portion of this heat transfer mechanism is found, however, to be attended by certain heat transfer difficulties or disadvantages, especially when the shapes, sizes, flow rates, materials, and nucleate boiling that are desirable for cooling electronic parts are considered.

More precisely, when an electronic part such as an integrated circuit chip protrudes into the stream of a cooling fluid, it is found that the occurrence of nucleate boiling at the leading edge of the electronic part can result in a secondary effect decrease in overall heat transfer effectiveness and some attending difficulties. When the vapor formed by leading edge boiling at the cooled electronic part is carried over the larger and most effective heat transfer surface of the electronic part, i.e., when this vapor is carried over the top area surface of the part a decrease in cooling effectiveness is found to occur. In this condition, the large surface area of the part is in fact partially shielded from liquid contact by the flow carried vapor which intervenes between the fluid body and the surface area of the electronic part.

In the present invention, the occurrence of this problem is recognized and is addressed with a class of solutions that are easily added to the electronic part environment in a cost-effective manner.

The U.S. patent art has recognized the desirability of efficient heat transfer through a moving fluid in several patents which are of general background interest with regard to the present invention. Included in this art is U.S. Pat. No. 5,158,136 issued to K. Azar and concerned with a pin fin heat sink which includes a flow enhancement improvement. In the Azar invention flow guide members are added around a pin fin heat sink and a gap is provided between the lower edges of the flow guide members and a base surface of the heat sink in order that potentially stagnant fluid in an interior region of the pin fin field be allowed to communicate with fluid flowing around the exterior of the heat sink. This arrangement enables a so-called "pumping" action in which the potentially stagnant fluid is drawn along with fluid flowing around the exterior of the heat sink. Since the Azar invention is concerned with a pin fin heat sink structure and with stagnant flow reduction and discloses only minimal or no nucleate boiling, the present invention is readily distinguished from the disclosure of the Azar patent.

The U.S. Pat. No. 5,077,601 of T. Hatada et al is also of this general background interest with respect to the present invention. The Hatada et al patent is concerned with a cooling system for an electronic device and a heat radiating fin for use in the cooling system. In the Hatada invention a cooling fluid, preferably air, is provided with a greater cross-sectional area at an upstream end of the electronic device with the cross-sectional area progressively decreasing toward the downstream end of the device's flow passage. The Hatada invention employs a number of obliquely disposed and airflow conforming heat exchange elements in the tinned assembly. Since the Hatada invention is not concerned with boiling or with the limitation of boiling degradation of a heat exchange arrangement, a ready distinction between the present invention and the Hatada et al apparatus is apparent.

U.S. Pat. No. 4,999,741 issued to S. G. Tyler is also of general interest with respect to the present invention and is concerned with a thermally conducting flexible membrane which may be disposed in intimate and heat conducting relationship with an electronic device in order to both hermetically seal the device and provide large area thermal contact with the device. Since the Tyler patent is also not concerned with boiling of a liquid coolant, a ready distinction with the present invention is apparent.

SUMMARY OF THE INVENTION

The present invention provides increased cooling stability and predictability for an electronic part or a heat exchanger component element which is subjected to total immersion in a moving fluid stream for dependence upon latent heat of vaporization or boiling mode cooling. The invention contemplates insertion of the electronic part or the heat source object into the coolant stream flow by certain minimum amounts as opposed to a flush mounting of the part—which is shown to be less desirable. The invention then avoids the unstable and often unpredictable consequences of a vapor film, originating in boiling at a leading edge surface of the cooled part, disrupting the expected coolant liquid contact with the heated part at its major heat-exchanging interface achieved. The invention achieved improved heat transfer stability, improved heat transfer efficiency, and smaller range of part operating temperature variation are in fact accomplished by precluding boiling and vapor formation at the leading edge of the electronic part or heat source object.

It is therefore an object of the present invention to stabilize the cooling achieved in a moving fluid nucleate boiling cooling system.

It is another object of the invention to achieve predictable and lower operating temperatures for a stream cooled heat source member such as an electronic part.

It is another object of the invention to exclude certain stream-disposed portions of a cooled heat source member from participation in a nucleate boiling sequence.

It is another object of the invention to teach the source of heretofore poorly-understood difficulties with the moving stream nucleate boiling cooling mechanism.

It is another object of the invention to provide a moving stream nucleate boiling cooling arrangement for an electronic part which also has applicability to the generic heat exchanger technical art.

Additional objects and features of the invention will be understood from the following description and claims, and the accompanying drawings.

These and other objects of the invention are achieved by the method of cooling an electronic part with nucleate boiling in a flowing stream of coolant fluid comprising the steps of:

disposing said electronic part in said flowing stream with a major surface portion thereof extending substantially parallel with said flowing stream and a lesser minor surface portion thereof extending substantially perpendicular to said flowing stream - in an upstream-most location of said part;

whereby nucleate boiling of said coolant fluid tends to occur at each of said major and minor surface portions and at any additional coolant exposed surface portions of said electronic part, and said nucleate boiling at said upstream-most lesser minor surface portion together with said flowing stream of coolant fluid tends to dispose an undesirable vapor film blanket from said lesser minor surface portion nucleate boiling over said major surface portion of said electronic part; and precluding said undesirable vapor film blanket disposition, to incease and stabilize nucleate boiling cooling of said electronic part major surface portion, by excluding said coolant fluid from boiling contact with a predetermined portion of said lesser minor surface portion of said electronic part.

DETAILED DESCRIPTION

Figure 1:
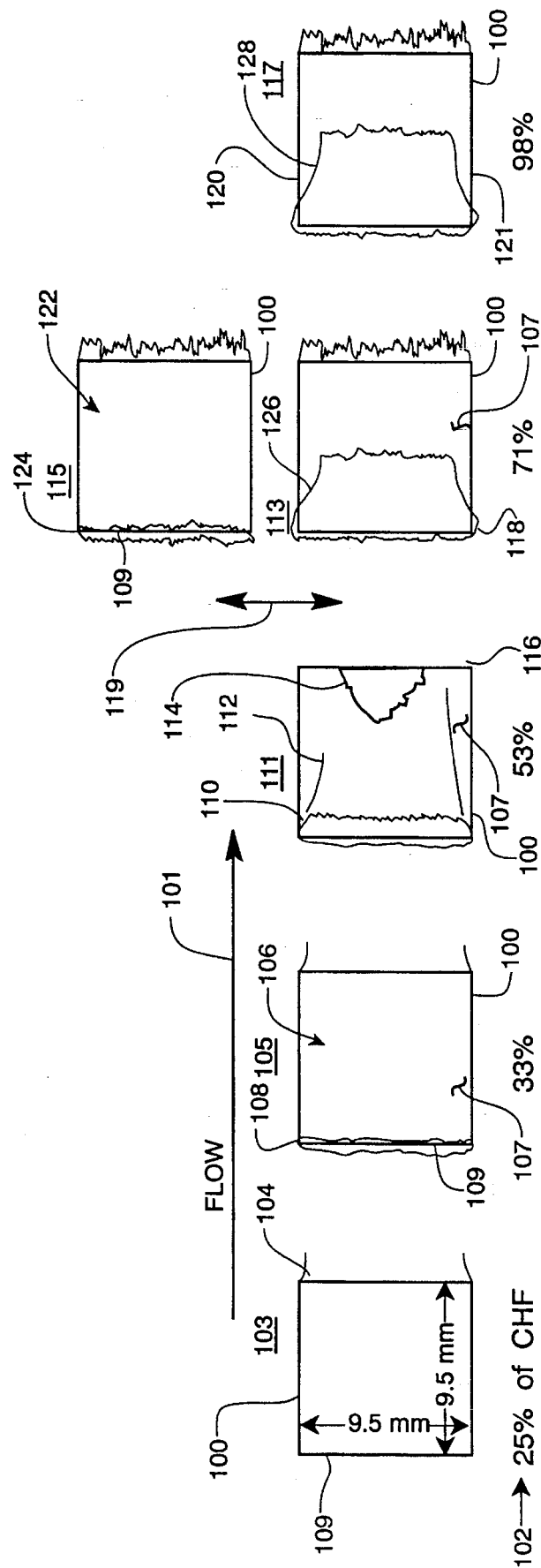
FIG. 1 shows the progression of a boiling cooling arrangement into areas of difficulty with increasing levels of dissipated energy input.

Electronic apparatus signals which were once measured in milliamperes of current flow, in the era of vacuum tubes and discrete solid state components, are now frequently measured in microamperes or nanoamperes of current flow. This significant decrease in current level, and a concurrent use of signal voltage swings in the range of 5 volts or less—in the electronic computing logic signal art, for example, enables significantly lower heat dissipation from a given electronic circuit. The insatiable appetite for more memory, more parallel processing, increased processing speed and smaller physical size for computer and other electronic apparatus nevertheless brings on a significant need for more effective heat energy dissipation from electronic circuit packages. Even in the business and consumer electronic art of the personal computer, for example, circuit densities have reached the level of no longer being able to rely on convection cooling or even fan cooling of some integrated circuit chips in order to maintain reasonable and circuit materials tolerant operating temperatures.

This temperature maintenance and cooling requirements problem is even more pronounced in the performance driven electronic art such as appears in the power amplifier, microwave and high-density logic integrated circuit packages employed in military equipment and other state-of-the-art electronic apparatus. Many military electronic systems for example, now rely on liquid cooling arrangements such as pressurized flow in tubes and manifolds in order to remove thermal energy from at least some electronic circuit packages in an operating system.

In order to minimize the physical size and weight penalties attending these liquid-based cooling systems, it is desirable to depart from the realm of heat transfer based on changing the temperature of a liquid over a few degrees, or even a larger temperature range such as 20 to 60 degrees. More precisely, it is desirable in such instances to avoid specific heat related cooling, and to employ the much larger heat transfer that is available from use of the latent heat of evaporation of a cooling liquid. In other words, the cooling of an electronic part through the use of boiling in a liquid that surrounds the part is an attractive heat removal mechanism for at least performance-driven present-day electronic systems. The availability of higher temperature semiconductor materials such as silicon, gallium arsenide and other compound materials in combination with the availability of relatively low boiling point coolant fluids such as the fluorocarbon liquids makes such boiling cooling of integrated circuit chips and other electronic parts a practical reality, even at the present state of the technical art.

Even though the boiling of liquids has been known for thousands of years, it is only in recent times that certain of the refined aspects of the liquid to vapor state change involved in this process have become understood to a degree enabling practical use of this mechanism in the precise requirements of semiconductor electronic device cooling. Present understanding of the liquid to vapor phase change, for example, distinguishes between film boiling, as is best observed in a quiescent liquid situation, and nucleate boiling as often occurs in a moving fluid environment. Attempts to understand frequently incurred events in the boiling cooling of an electronic circuit package and to resolve certain difficulties which boiling cooling appears to present in the dissipation of heat from an of electronic circuit package has led to the present invention.

In particular, the physical parameters attending the cooling of an electronic circuit package, parameters such as reasonably attainable coolant quantities and flow velocities, and to-be-expected electronic circuit package shapes and sizes, together with the desire for efficient, predictable, stable, and temperature-limited heat transfer from these electronic packages has illuminated a particular difficulty that is to be expected in the use of boiling heat transfer from an electronic circuit package and a means for its resolution.

It should be understood that the presently considered heat transfer arrangement and the present invention are to be distinguished from the use of coolant flowing over a flush mounted electronic circuit package. In such arrangements the coolant flow path, although constrained within a particular conduit or channel, nevertheless occurs over a smooth surface which includes both the electronic circuit package surface and adjoining surfaces, all of which are confined to a smooth and effectively uninterrupted, single plane, for example. Such flush chip mounting arrangements have proven difficult to fabricate and maintain in satisfactory operating condition outside of the laboratory and are therefore desirably improved upon by arrangements such as the present invention.

The present invention therefore contemplates the insertion of an electronic circuit package into a flowing stream of coolant fluid. This stream insertion arrangement is found to present both significant performance advantages and certain difficulties which are overcome by the present invention.

A more complete explanation of this background for the present invention and a study of the boiling which occurs at the surfaces of an integrated circuit chip electronic package, for example, is to be found in the technical paper of the present inventor and a colleague, the paper titled "Boiling From the Top and Sides of a Protruding Simulated Electronic Chip" authored by J. E. Leland and L. C. Chow, presented at the 28th Thermophysics Conference of the American Institute of Aeronautics and Astronauts, Jul. 6–9, 1993, at Orlando Fla. This paper is herein referred to as the Leland and Chow technical paper; the paper is declared to be a work of the U.S. Government. The contents of this Leland and Chow technical paper are hereby incorporated by reference into the present patent document. Yet additional information concerning these concepts is to be found in the U.S. Air Force Technical Report authored by the inventor and titled "The Effects of Channel Curvature and Protrusion Height on Nucleate Boiling and the Critical Heat Flux of a Simulated Electronic Chip" which will be available from The National Technical Information Service (NTIS) as the Wright Laboratory Technical Report WL-TR-94-2051; the contents of this technical report are also hereby incorporated by reference herein.

One problem referred to above and encountered with attempts to use immersion cooling and boiling coolant fluid heat removal from an electronic circuit chip package is illustrated in FIG. 1 of the drawings herein.

Although FIG. 1 and indeed, much of the disclosure of the present patent document is couched in terms of describing events which occur in cooling an electronic part such as an integrated circuit chip (or its enclosing housing), it will be readily apparent to persons skilled in the art that the concepts disclosed and the invention are equally applicable to the heat exchanging art in general and may therefore find application in such widely diverse fields as the generation of steam in a boiler, the transfer of heat into a boiling liquid in the evaporator of a refrigeration system, and indeed, in any heat exchange situation wherein the liquid to vapor phase change occurs. This wider applicability of the present invention is indicated in the latter portion of the invention's title as recited above, and indeed, certain of the claims appended to this specification recite heat exchange concepts that are not limited to the electronic device cooling art.

FIG. 1 in the drawings therefore shows the onset of a cooling degradation mechanism which can be expected under certain, but likely to be encountered in electronic device cooling, conditions of physical size, flow rate, coolant liquid properties, and flow path configuration. In FIG. 1 the block 100 represents a simulated integrated circuit package which extends into the flow path of a cooling fluid by height dimension of 0.635 mm and under the conditions of a 2 meter per second flow rate in the direction indicated at 101. A coolant fluid temperature, at the left extremity of the FIG. 1 drawing, of 20° C. below the coolant boiling temperature is presumed; i.e., FIG. 1 represents a 20° C. subcooling condition. A coolant such as the dielectric fluorocarbon designated as FC-72 which is sold by 3M Industrial Chemical Products Division, is typical of the coolant fluids which may be used in a FIG. 1 electronic cooling situation. The FC-72 fluid as well as R-12 refrigerant, distilled and deionozed water and other possible cooling fluids are dielectric in nature; the block 100 may therefore be presumed to be at some different electrical potential than its surroundings or to include regions of differing electrical potential along its surfaces. The block 100 may have the FIG. 1 disclosed width and length dimensions of 9.5 millimeters and 9.5 millimeters, respectively, dimensions which are typical of circuit packages found in the present day integrated circuit electronic art.

The horizontal line of numbers at 102 in FIG. 1 indicates the differing quanties of energy dissipated in the block 100 with respect to the critical heat flux condition i.e., the energy input with respect to the point at which transition from nucleate boiling to film boiling occurs. The transition at the critical heat flux (CHF) point is marked by a large and rapid temperature excursion of the block 100, a temperature excursion which is often accompanied by burnout of a heating element which provides energy to the block via laboratory setting and this point is therefore often called the burnout heat flux. As indicated at 102, the energy inputs to the block 100 vary between 25 and 98% of the CHF value.

In the first view of the block 100 at 103 in FIG. 1, an energy input of 25% of the CHF value is represented and, as is indicated at 104, at this heat flux level nucleation of the cooling fluid surrounding the block 100 occurs on the trailing edge portion, i.e., a portion of height 0.635 mm of the block 100. In the view 105 where a heat flux of 33% of the CHF value is represented, a small vapor blanket has formed on the leading face 109 of the block 100 and small portions of this leading edge vapor blanket i.e., random vapor bubbles 106, are carried by the fluid flow indicated at 101 over the upward facing major surface 107 of the block 100.

As illustrated in the view at 111, with an increase to 53% of the CHF value, the small vapor blanket 108 expands in coverage of the surface 107, as indicated at 110, and nucleation also proceeds from a preferred site on the trailing ⅓ of the surface 107 as is indicated at 114. In addition, at this 53% of CHF energization level, the effect of the flow 101 on the random vapor bubbles 106 is more pronounced and tends to concentrate in the central portion of the surface 107 as is indicated at 112. As additionally shown in the view 111, at this 53% of CHF energy input level, the trailing edge nucleation has become more intense and joins the trailing ⅓ of the surface 107 nucleation.

A condition of special interest with respect to the cooling of an electronic part or concerning the temperature excursions in a heat exchanger is illustrated for the condition of 71% of the CHF energy level in the views at 113 and 115 in FIG. 1. As illustrated at 126 in the view 113, at this energy input level the leading edge nucleation has grown to cover almost ⅓ of the surface 107 and the bubbles from this blanket of vapor extend over a substantial part of the remaining area of the surface 107. However, as is indicated by the double-ended arrow at 119, the condition of the view 113 is not stable, but instead alternates with the condition indicated in the view 115, i.e., with a condition wherein nucleation is confined to a small frontal face 109 region as at 108 in the view 105. However, the vapor bubbles formed as a result of this 71% higher input energy level front edge nucleation extend over substantially all of the surface 107 as is indicated at 122.

In fact, alternation between the conditions of the views 113 and 115 occurs rapidly and at an unsteady but roughly 20 Hz frequency. In the condition of the view 113, the vapor blanket is growing toward an ultimate coverage of about 50% of the surface 107, at which point the blanket 126 breaks into a bubble stream as illustrated at 122 and the conditions of the view 115 prevail and proceed again toward the conditions of the view 113. The oscillation indicated at 119 between the conditions of views 113 and 115 has an amplitude of about 4 mm; this is the amplitude change at 126 after the instability represented at 119 commences. Prior to this instability the blanket 126 also oscillates, but with a smaller amplitude of about 1 millimeter.

It is also interesting to note that the vapor blanket 126 in the views 113 and 115 extends over the lateral edge surfaces of the block 100, i.e., the edges indicated at 120 and 121 in the view 117 of FIG. 1 extends to to a degree indicated at 118 in the view 113. It is significant to note, however, that this extension over the non-leading and trailing edges of the block 100 appears not to originate in nucleation occurring on these edges, but rather from nucleation occurring on the front face 109 or leading edge of the block 100.

For purposes of the present invention, it is significant to realize that the condition of the views at 113 and 115 in FIG. 1 is also accompanied by an oscillation of the surface temperature of the block 100 i.e., by an oscillatory change of temperature of the electronic device represented by the block 100—Temperature oscillation occurs because of the resulting drying and rewetting of the surface 107 by the coolant liquid. Such an oscillatory temperature change is of course highly undesirable in most electronic circuit applications.

With increase of the energy input level to the block 100 to the 98% of CHF condition as represented in the view 117 of FIG. 1, another phenomenon of significant interest with respect to the cooling of an electronic circuit chip or other electronic part or with respect to operating temperature limits in a heat exchanging device is encountered. With this increase from the 71% to 98% of CHF value, as is illustrated between the views of 113–115 and 117 in FIG. 1, a sudden increase in wall superheat (i.e., temperature of the surface 107 of the block 100) occurs along with extension of the vapor blanket 126 to a coverage of about 60% of the heated surface as is indicated at 128 in the view 117 of FIG. 1. This temperature increase is also found to be accompanied by continued oscillation of the vapor blanket horizontal length with an amplitude of roughly 2 mm.

Figure 2:
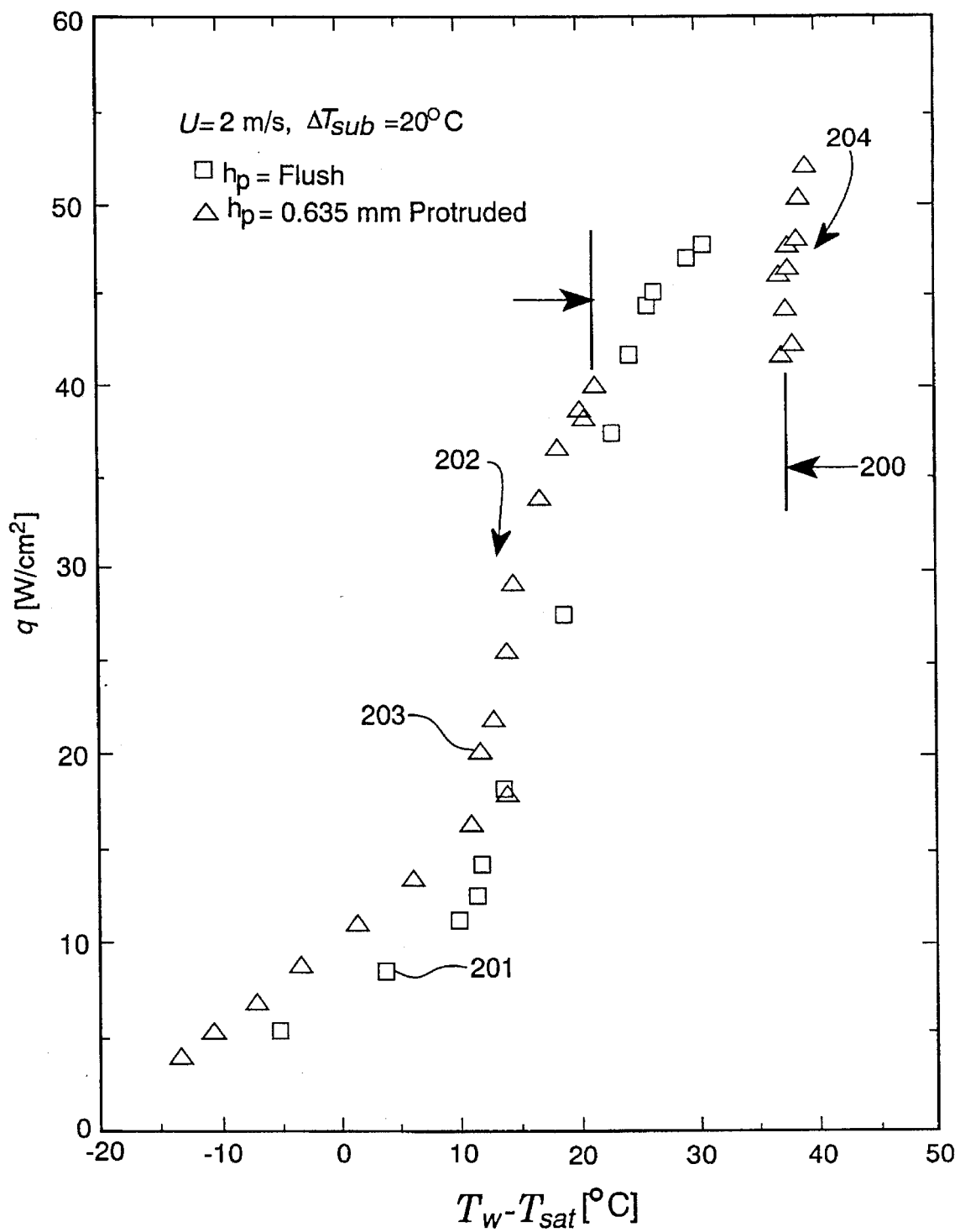
FIG. 2 shows the behavior of a boiling cooling curve in the presence of increasing projection of an energy dissipating element into the fluid stream and a region of difficulty in such cooling.

The temperature change occurring between the views of 113–115 and 117 is illustrated graphically at 200 in FIG. 2. The FIG. 2 curves 201 and 203 represent heat flux, in watts/cm² vs wall superheat (i.e. $T_w$-$T_{saT}$ in °C. where $T_w$ =the average surface temperature and $T^{saT}$= (the saturation temperature of the liquid) for two differing projections of the block 100 surface 107 into the stream flow—as is indicated in the legend in the upper left portion of the figure. The segregated portions of the curve 203 indicated at 202 and 204—the portions that are separated by this temperature change 200, arise from a 0.635 mm height of the surface 107 of the block 100 into the fluid stream as prevails for the FIG. 1 drawing. A sudden and unstable temperature change such as is represented at 200 in FIG. 2 is of course also undesirable for the cooling of an electronic part.

Beyond the condition represented at 117 in FIG. 1, an increase of energy level to the block 100 is accompanied by little temperature change, a condition which implies the activation of additional nucleation sites. The 2 mm amplitude oscillation also dies out during this increase in energy input beyond the conditions of the view 117.

In the FIG. 1 drawing it is significant to realize that the large vapor blanket at 110, 126 and 128 is itself an undesirable condition for the cooling of an electronic part or for effective, stable, and damage-free heat transfer in a heat exchanger since this blanket area represents poorly cooled and temperature increased surface area of the block 100. In addition to this blanket covered area being partly or intermittently thermally isolated from the coolant fluid, the dimensional fluctuation of this area and the accompanying oscillatory fluctuation of temperature as noted for the views of 113 and 115 in FIG. 1 is undesirable for electronic part cooling or thermal energy transfer and the large and sudden jump in temperature represented between the views of 113–115 and 117 and described at 200 in FIG. 2 is also undesirable. A major aspect of the present invention is in fact the elimination of these and other possible undesirable effects from the cooling represented in the FIG. 1 and FIG 2 drawings. It is significant to realize that in addition to the sudden and large temperature change represented by the "gap" at 200 in the FIG. 2 curve, this region also represents an instability and a region of undesired unpredictability or control loss in the cooling of an electronic part.

Although the concepts described in FIG. 1 are most easily visualized when the bubbles at the front face 109 are considered to rise into the cooling fluid from their nucleation site prior to being swept over the face 107 by the flow 101, that is, the FIG. 1 phenomenon is most easily visualized when the block 100 is in the FIG. 1 illustrated "upright" condition, this orientation is not a necessary condition. The FIG. 1 effects are in fact to be expected when the face 107 is directed horizontally, downward or at some oblique angle since vapor from the nucleation at the face 109 will also be captured in the flow 101 to a significant degree in these other orientations. Similarly, the surfaces 107 and 109 need not be fully perpendicular and parallel with the flow 101 but may have only area components that are so oriented. Such area components could of course be included in an irregular shape for the block 100.

Before proceeding into a discussion of the elimination of the FIG. 1 undesirable effects, it is interesting to note that variations of the conditions specified for the FIG. 1 drawing have some effect on the performance of a FIG. 1 type cooling arrangement, as will be briefly discussed in the following paragraphs. A more complete discussion of these variations may be found in the above incorporated-by-reference technical papers of the inventors herein.

Figure 3:
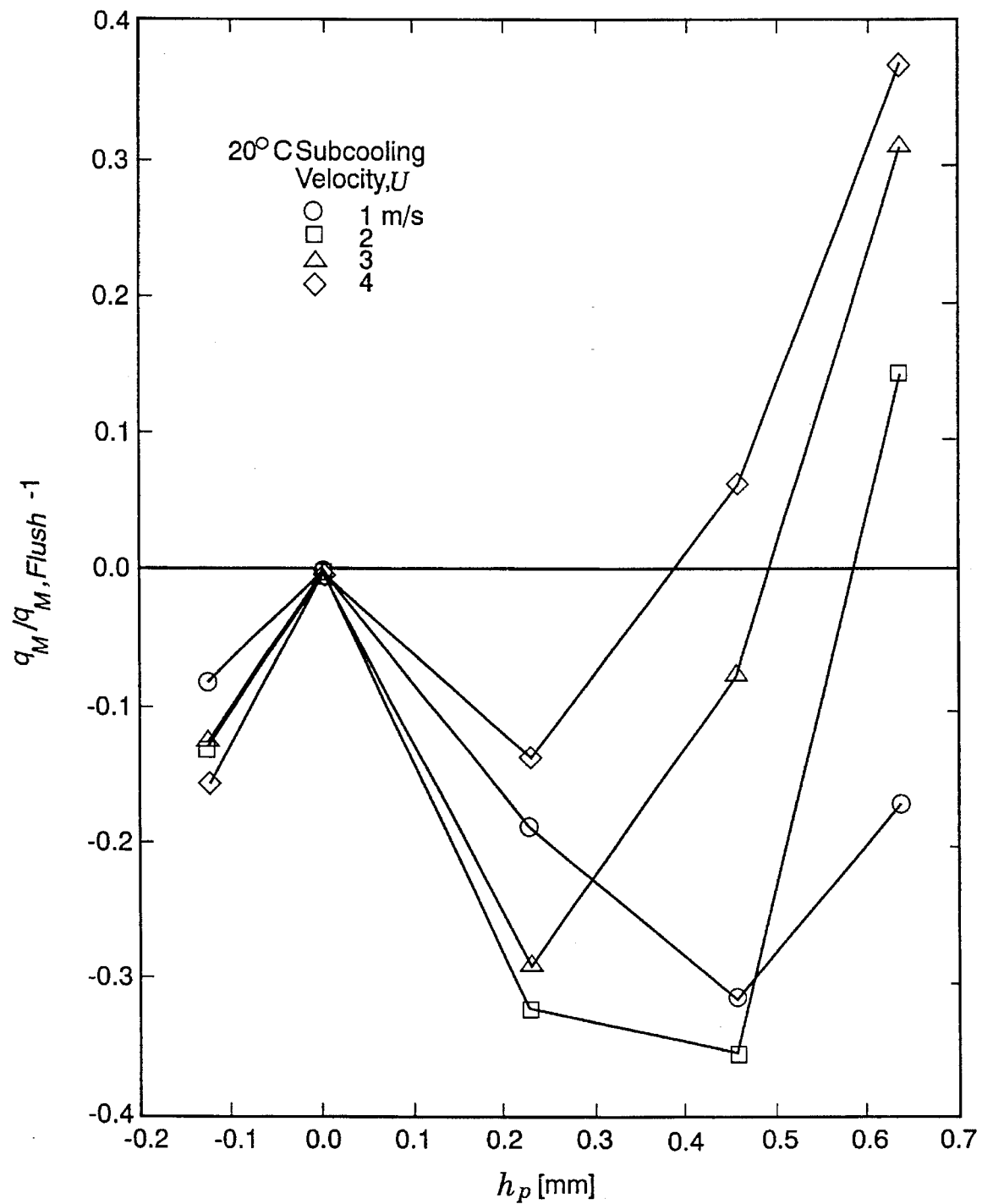
FIG. 3 shows a variation of critical heat flux with cooled element projection into a cooling stream for one subcooling temperature range.

FIG. 3 in the drawings illustrates several of the effects of changing the stated conditions for the FIG. 1 drawing. In FIG. 3 there is shown a family of four curves representing the critical heat flux in response to changes of cooled component height or projection into the flowing stream and in response to changes in stream velocity flowing over the cooled part surface. As indicated in the legend for the FIG. 3 drawing, four differing velocity values are represented for twenty degrees of subcooling. As is illustrated by the FIG. 3 curves, projection of the cooled part into a flowing stream can result in a desirable improvement in the CHF value represented on the left axis of FIG. 3, for the situations where the flow velocity is significant and the projection height is also significant. Such projection can, however, actually provide a critical heat flux disadvantage for low velocity and low projection conditions.

Even in these disadvantaged CHF situations, however, an elimination of the difficulties represented in FIG. 1 as accomplished in the present invention makes the use of cooled part projection into the flowing stream a net advantage in many situations. Parenthetically, the twenty degrees of subcooling indicated for the FIG. 3 curves or even lesser degrees of subcooling are the conditions of greatest interest with respect to the phase change or boiling cooling mechanism of the present invention since greater degrees of subcooling represent situations in which specific heat cooling (i.e., non-phase change energy input) must occur in the cooling fluid before the desired large heat transfer-capable phase change occurs. A curve family representing the FIG. 3 data with a 35° C. subcooling is similar to the FIG. 3 family of curves except the four curves are less segregated in amplitude.

The curves of FIG. 2 herein which were referred to in the above FIG. 1 discussion in connection with the temperature gap shown at 200 also illustrate an effect of changing the described conditions for the FIG. 1 drawing. The two curves 201 and 203 represented in FIG. 2 show the change from a flush surface condition or zero projection of the cooled part into the flow stream to the above referred-to 0.635 mm protrusion into the flow stream.

It should also be recognized that projection height and stream velocity in fact have significant influence on the FIG. 1 phenomenon—especially for for lesser values of surface height and stream velocity. Specifically, the vapor blanket growth illustrated in the views 111, 113 and 117 of FIG. 1 is found to depend upon the presence of at least minimal projection height and stream velocity for its occurrence. For example, for a projection height $h_p$ of 0.229 mm and a stream velocity, U of less than 3 meters per second this vapor blanket growth is found not to occur. Similarly for values of U less than 2 meters per second and $h_p$ of 0.457 and 0.635 mm, the vapor blanket growth also does not occur. Bubble generation from these shorter vapor blankets does increase with increasing heat flux, however. At greater degrees of subcooling, such as 35° C. for example the vapor blanket grows to a length of only about i mm. It is believed that the effect of moving coolant over these small and vertically oriented surfaces precludes the attainment of coolant vaporization even with the relatively small 20 degrees of subcooling represented in the FIG. 1 drawing. The FIG. 1 illustrated phenomenon is found to occur for cooled part or block projections of 0.457 and 0.635 mm at the 2 meter per second and 20 degrees of subcooling conditions.

Additional details concerning the effect of varying the conditions specified for the FIG. 1 drawing and the phenomenon illustrated there are to be found in the above referred-to and herein incorporated-by-reference technical papers which describe the simulation of a cooled electronic part using a copper block and other heat sources. The above described variations in the FIG. 1 conditions together with the availability of additional details in these incorporated by reference technical papers is believed sufficient for the present purpose of supporting disclosure for a cooling arrangement precluding the disadvantages represented in FIG. 1.

Notwithstanding the difficulties noted in the FIG. 1 drawing, the use of significant cooled part projections into the coolant stream generally provides an increase in available power dissipation because of the combined contributions of greater exposed surface area and an increase in the quantity $q_M$ (i.e., the CHF). Generally, for a heater height of 0.635 mm and the 20° C. subcooling condition, a 60% increase in power dissipated is found for velocities over 2 meters per second.

In the FIG. 1 cooling situation therefore, boiling occurs predominantly on the front, top and rear faces of an electronic part represented by the block 100. Notably, nucleation from the lateral sides of the FIG. 1 block 100, the sides parallel to the direction of coolant flow, is not observed. For a given protrusion height of the cooled part the critical heat flux based on exposed area is reduced at low velocities, is equal at some intermediate velocity, and is increased at higher velocities as compared to the case where the heat dissipating surface is flush with the fluid containment wall. As protrusion height increases, the break even velocity decreases and the increase in CHF is greater for a given velocity that is larger than the break even velocity. The net increase in CHF is believed to be due in part to the strong interaction between vapor emanating from the cooled part front face 109 in FIG. 1, and the vapor from the top of the heated part i.e., the surface 107 in FIG. 1.

It is particularly notable that if the block 100 in FIG. 1 is replaced with a thin foil heater so that there is no front face surface 109 of the block, then a smooth uniform bubble layer evolves on the top surface of the block just as occurs for the flush face flow condition. The bubble layer in the absence of a front face 109 is however thinner than the flush surface bubble layer for a given velocity. This thinner bubble layer is because of higher fluid velocity near the front face wall for the protruded case as shown in FIG. 1, causing the bubbles from the top surface 107 to move downstream at a greater rate. This higher velocity is also due to a redeveloping boundary layer. The higher velocity also acts toward improving the liquid supply mechanism for the nucleate boiling and thus inhibits onset of the CHF condition.

Figure 4:
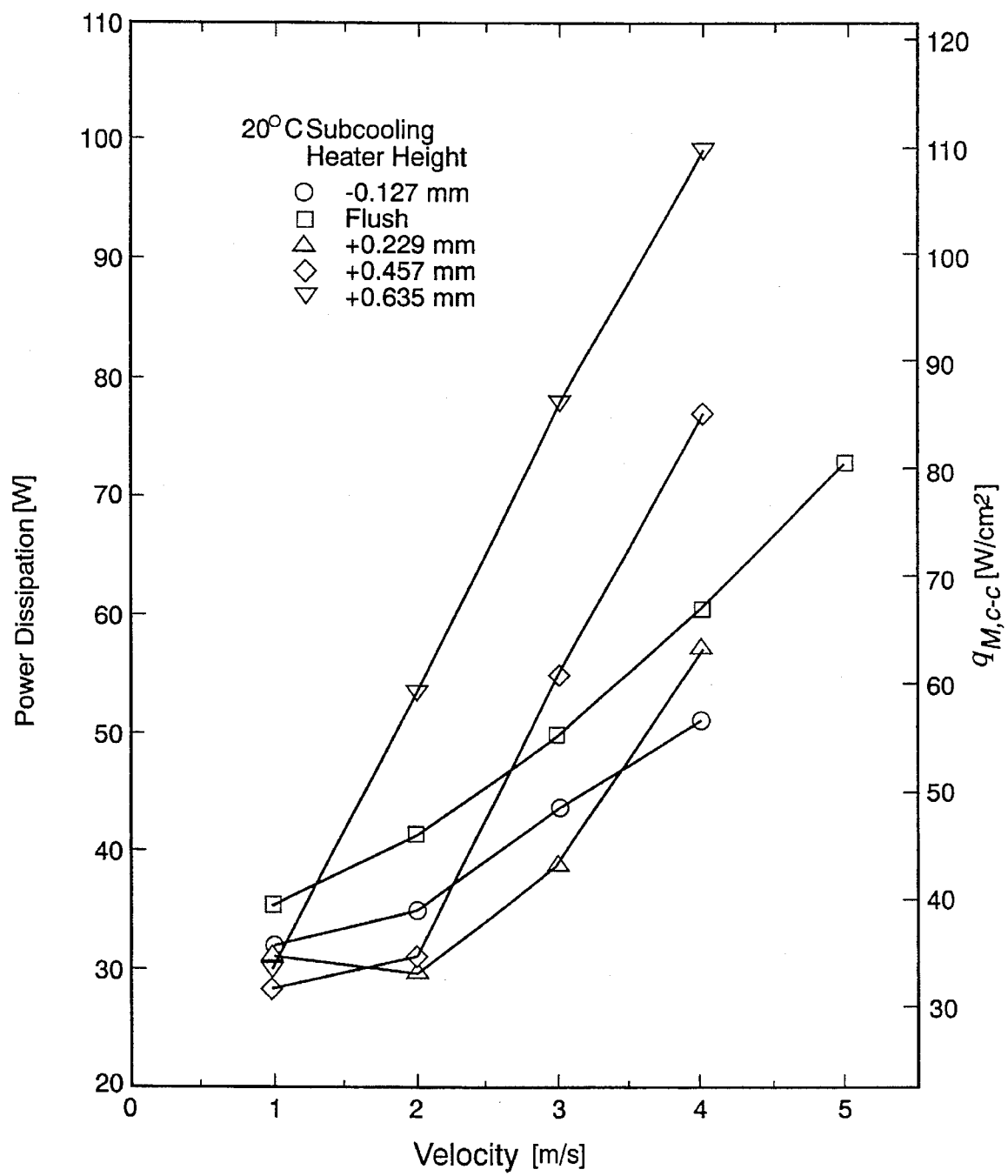
FIG. 4 shows the variation of maximum power dissipation with projection height of the cooled element into a fluid stream.

The advantages of cooled element protrusion into the coolant stream flow are also illustrated in FIG. 4 of the drawings, where the variation of achievable power dissipation with a range of differing protrusion heights is shown. The FIG. 4 heights range from a recessed condition to the 0.635 mm protrusion of the FIG. 1 cooling situation. FIG. 4 also shows the effect of coolant velocity in this achievable dissipation. As illustrated in FIG. 4, the FIG. 1 represented 0.635 mm protrusion offers significant advantages over the lesser protrusions. Turbulent flow is present in the FIG. 1 cooling environment. The effects described in FIG. 1 are not, however, conditioned on the presence of such turbulent flow.

An in-depth reflection on the conditions and results disclosed in connection with FIG. 1 herein suggests to the present inventor that the elimination of boiling and bubble formation at the front face 109 of the FIG. 1 block is a desirable improvement to the FIG. 1 cooling. Both the undesirable oscillation represented at 119 in FIG. 1 and the instability described at 200 in FIG. 2 as well as the loss of heat transfer resulting from the large vapor blanket at 126 and 128 in FIG. 1 are reasonably expected benefits from an elimination of this front face boiling and resulting vapor blanket enhancement in the FIG. 1 situation.

Figure 5:
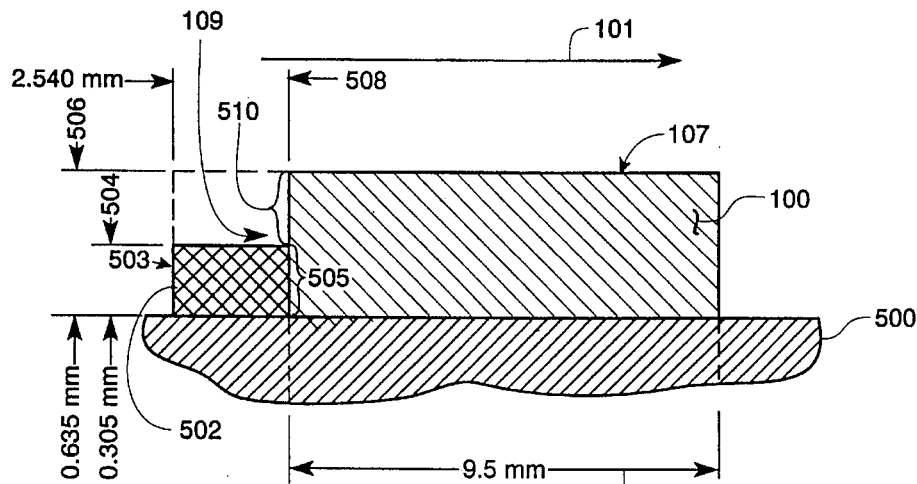
FIG. 5 shows a cross-sectional view of the FIG. 1 cooled element together with a present invention improvement to the cooling environment.

FIG. 5 in the drawings shows one arrangement by which the upstream face 109 related vapor film blanket effects of FIG. 1 may be improved upon. In the FIG. 5 drawing the block 100 representing the electronic part to be cooled, primarily via its uppermost surface face 107, is shown in cross-sectional view along with the substrate 500 from which the block 100 projects. The flow direction indicated at 101 in FIG. 1 is repeated at 101 in FIG. 5 as is the length dimension of the block 100 at 501. The projection height of the block 100 is indicated at 506 in FIG. 5.

At 502 in the FIG. 5 drawing is shown an element which is added to the block 100 in order to preclude the upstream face vapor blanket related difficulties noted in FIG. 1. This added element 502 is shown in FIG. 5 to take the form of a rectangular cross-sectioned block of thermal insulating material which partially covers the upstream face 109 of the block 100. The purpose of the added element 502 block of insulating material is of course to at least partially preclude upstream face contact between the cooling fluid of the flow 101 and the heated energy dissipating block 100 at this important upstream face 109.

By way of the thermal insulating properties of this added element 502 the front face 503 of this element is caused to operate at a significantly lower temperature than is the front face 109 of the energy dissipating block 100 so that no boiling occurs at the front face 503. By way of exclusion of the cooling fluid from the portion 505 of the front face 109, boiling and vapor formation which would normally occur in this area is also precluded and boiling at the face 109 is either substantially reduced or totally eliminated. By this reduction or elimination, the vapor which would undesirably be carried over the major surface 107 of the block 100 is efficiently precluded.

As shown in FIG. 5, the added element of insulating material at 502 is arranged to cover only a portion of the upstream face 109 and the remaining portion 510 of this face 109 is allowed to remain in contact with the cooling fluid. In this partial covering arrangement of the invention, the presence of the insulating material of the added element 502 is at least sufficient to significantly reduce the amount of bubble and vapor formation at the front face 109 and in fact in many operating conditions is sufficient to substantially exclude the formation of front face vapor. This reduction or exclusion is believed to occur because the smaller remaining area 510 of the face 109 is better cooled by the flow 101 and the smaller amount of vapor which can form in this remaining portion of the face 109 is condensed to the liquid phase by the surrounding fluid before being carried over the surface.

Partial coverage of the face 109, e.g. the illustrated half coverage is also selected in FIG. 5 because there is a desired balance between the amount of heat flux generated at the front face 109 and the ensuing amount of vapor. According to this balance, front face communication of a part of the dissipated energy is good in its achieving additional cooling, and front face communication and front face vapor is also bad because the generated vapor prevents wetting of the top surface. Partial rather than full coverage of the face 109 is also selected because some vapor sweeping over the top surface appears to create a flow pattern which is favorable for wetting of the downstream portion of the top surface. Therefore, in some cooling conditions full coverage of the front face 109 is actually not desired.

Typical dimensions for the added element 502 of thermal insulation are indicated at 504 and 508 in the FIG. 5 drawing. This thermal insulating element may be composed of a variety of possible thermal insulating materials so long as chemical and physical compatibility with the surrounding elements is maintained. A material known as Glastherm HT® made by General Electric Company has been found suitable for this purpose. A high-temperature silicone sealant may be used between the added element 502 and the block 100 in order to exclude cooling fluid from this junction and in order to maintain physical attachment with the block 100.

Figure 6:
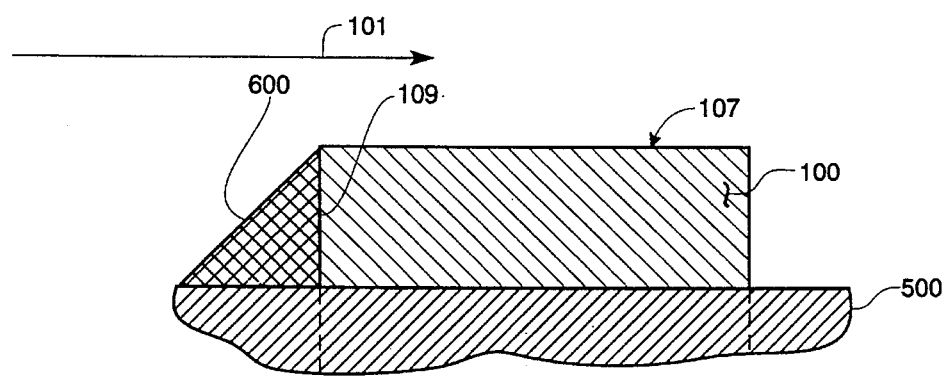
FIG. 6 shows an alternate arrangement of the FIG. 4 improvement.

A second configuration of the added element 502 is shown at 600 in the FIG. 6 drawing. In this configuration the block of thermal insulating material 600 is arranged in a triangular cross-sectional shape and disposed to provide a sloping front interface with the flow indicated at 101. Such a sloping front interface may have desirable properties under some flow and cooling conditions and achieves at least part of the effect of the FIG. 5 non full coverage of the front face 109 by way of the minimal thickness of the element 600 at its top extremity.

As may be surmised from the added element configurations of FIGS. 5 and 6, the most optimum shape for this added element may vary according to flow rates, coolant properties, thermal conductivity of the insulator material and other conditions that are determined by each cooling application. The shapes at 502 and 600 are therefore but exemplary of the arrangements which may occur to persons skilled in the fluid flow and heat exchange arts.

These shapes at 502 and 600 may for example, be replaced by a shape which varies in dimensions across the lateral face 109, that is, varies along the vertical dimension in FIG. 1, such as a sawtooth pattern of three-dimensional peaks and valleys or other configurations—in order to optimize the invention for a particular use. The important concept in such variations is of course to preclude to an adequate degree, the surface 107 coverage by boiling and vapor formation from the leading edge face 109 of the block 100. By eliminating at least part of the vapor formed at the face 109 from the surface 107 the extent of the front surface related vapor blanket shown at 108, 110, 124, 126 and 128 in FIG. 1 may be limited or eliminated and the undesirable results described in connection with FIG. 1 improved upon.

Since the desired arrangement is to preclude some of the vapor formation and boiling at the face 109 of the FIG. 1 apparatus from surface 107 coverage, other arrangements in addition to the insulating material of FIGS. 5 and 6 may also be practical in certain cooling situations. For example, measures to increase the flow rate of liquid coolant onto the front face 109 or measures to artificially increase the surface area of the front face 109 without increasing the energy to be dissipated from this front face may also be feasible for precluding the FIG. 1 illustrated vapor blanket difficulties. Similarly, in some applications of the invention, an arrangement to collect the vapor formed at the face 109 and remove it from the FIG. 1 scene may also be feasible in specific uses of the invention.

Figure 10:
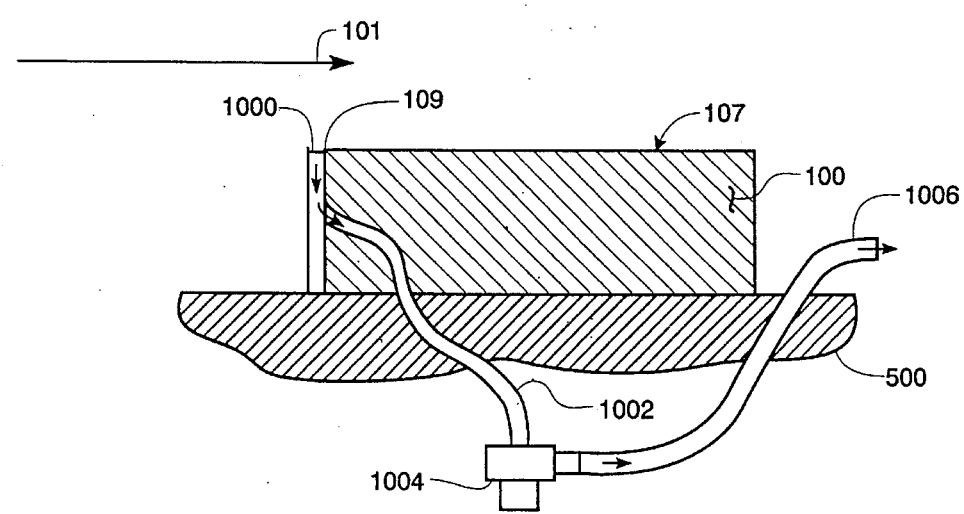
FIG. 10 shows an alternate arrangement for achieving a primary purpose of the invention.

Such an arrangement could include suction of the front face vapor into the coolant channel wall via small holes, or redirection of the coolant flow so that vapor is not swept over the entire top surface. This may be achieved by the manifold 1000 and the path of elements 1002, 1004 and 1006 shown in FIG. 10 of the drawings. According to this FIG. 10 arrangement the pump 1004 provides suction at the front face 109 which collects vapor (and liquid) into the manifold 1000 for discharge through the path 1006 in a downstream portion of the coolant flow. This suction arrangement therefore also serves the underlying purpose of eliminating or at least limiting the amount of front face 109 vapor that can be drawn across the surface 107 to cause the FIG. 1 difficulty.

The FIG. 5 and 6 insulating material additions to the FIG. 1 cooling environment are believed to enable full enhancement of a redeveloping velocity layer over the top surface 107 of the block 100 through elimination of boiling from the front edge surface 109. It is presumed of course, that the heat generation within an integrated circuit chip or other electronic part being cooled by the FIG. 1 environment is generated and distributed uniformly over the surface at the front face 109. Other heat distributions will ease or intensify the FIG. 1 phenomena, depending on their pattern.

Figure 7:
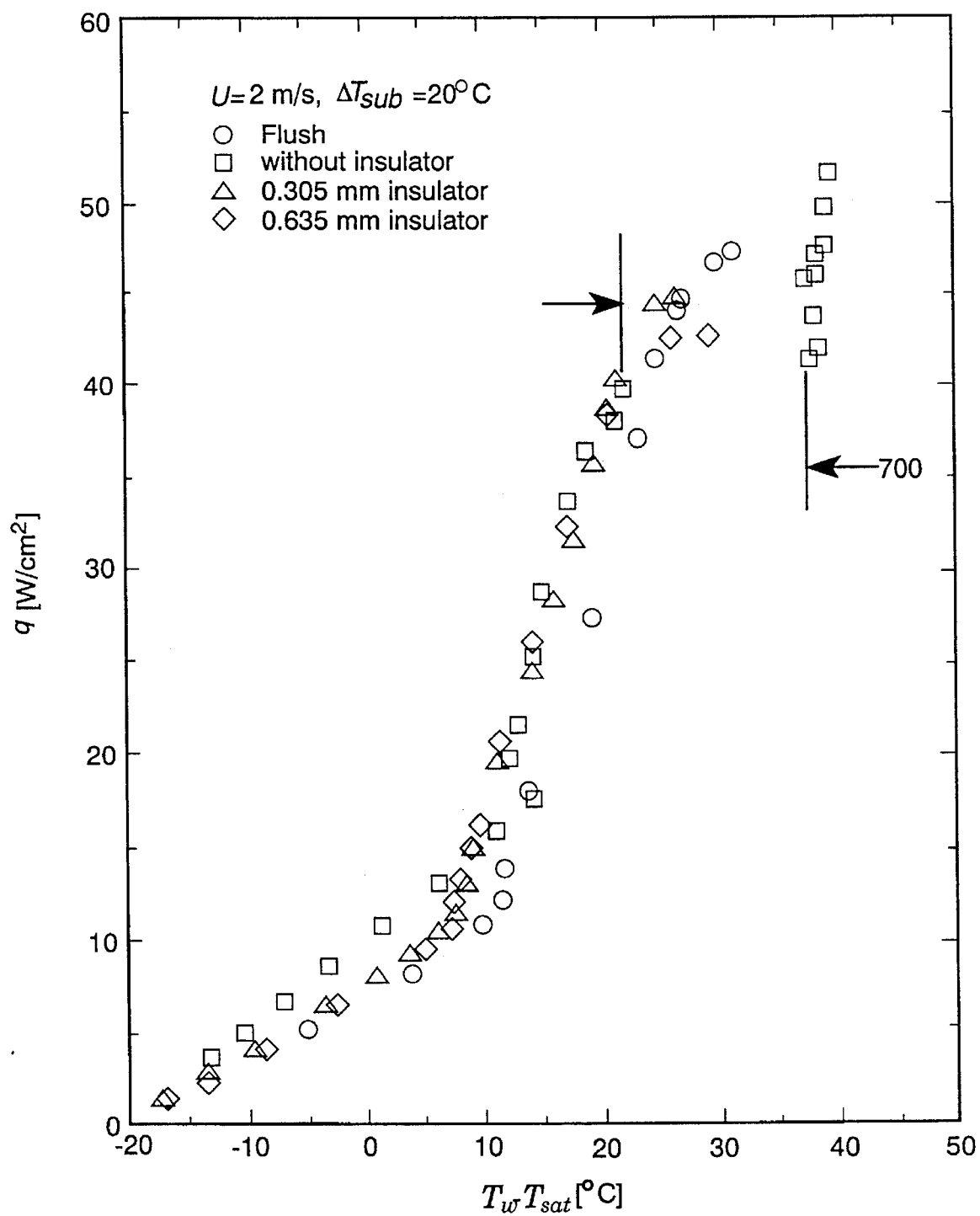
FIG. 7 shows an improved version of the FIG. 2 curve.

FIG. 7 in the drawings shows the effect of the added element 502 in a curve of the FIG. 2 type for the 2 meters per second flow velocity and for four differing cooled part projection conditions. The FIG. 7 data includes a flush mounting of the block 100—with the face 109 being of zero area, and includes the two levels of insulation height 504 specified in the FIG. 7 drawing. The instability phenomenon shown at 200 in FIG. 2 appears again at 700 in FIG. 7—for the without-insulator at 502 condition that is represented by the square block data values.

Also shown in the FIG. 7 curve family are the effects of a half and full block height at 504 for the added element 502 of insulating material. As indicated by the triangular and diamond-shaped data values of the "with-insulation" curves in the FIG. 7 family, the instability area represented at 700 is no longer present when boiling at the face 109 is precluded. The absence of this instability, with the thickness of insulating material shown in FIG. 5, of course raises the question of the thickness needed for this insulation material in order to achieve the desired results, i.e., a thickness less than the 2.54 mm indicated at 508 in FIG. 5 may be sufficient.

Figure 8:
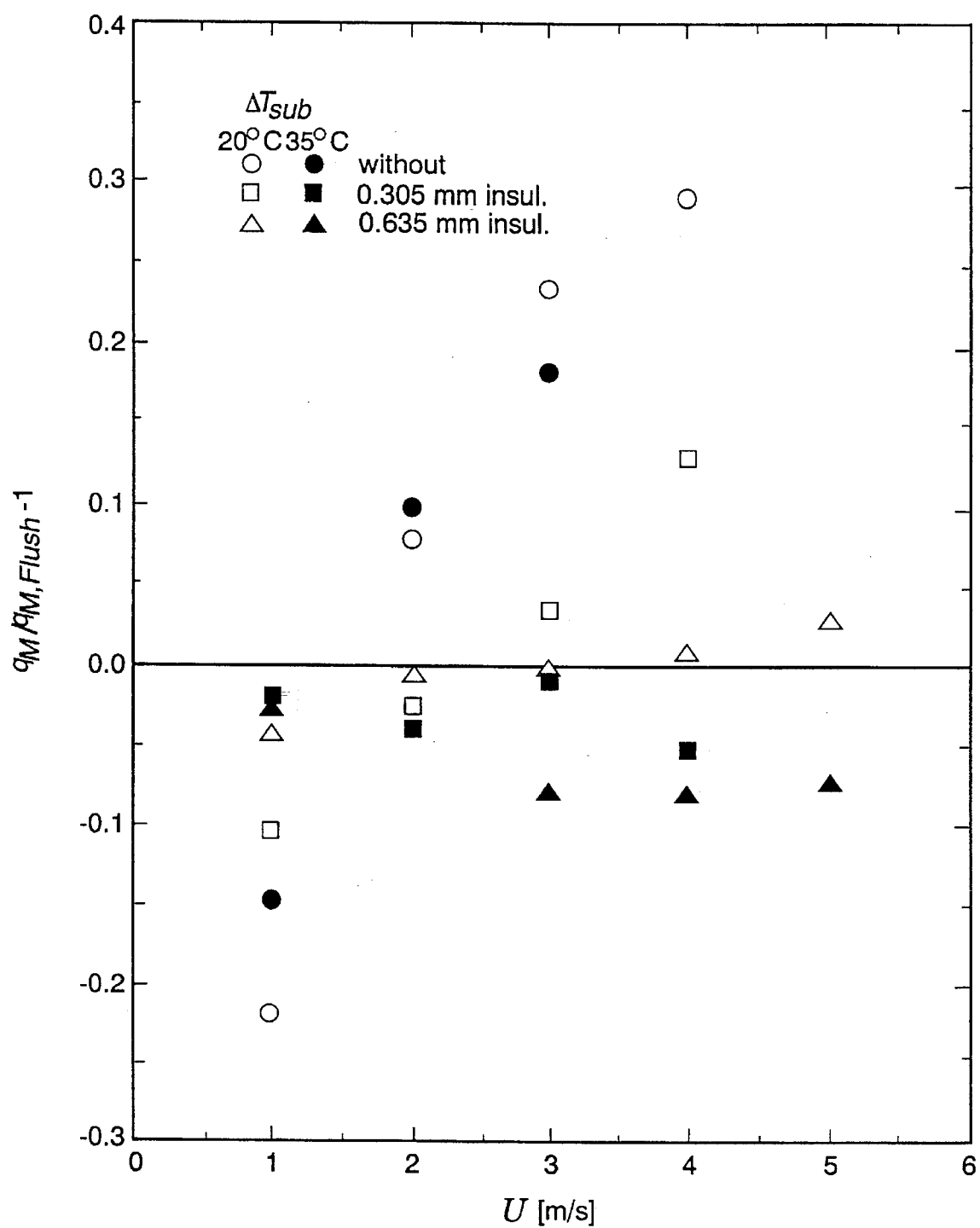
FIG. 8 shows characteristics improvement achievable with the invention.
Figure 9:
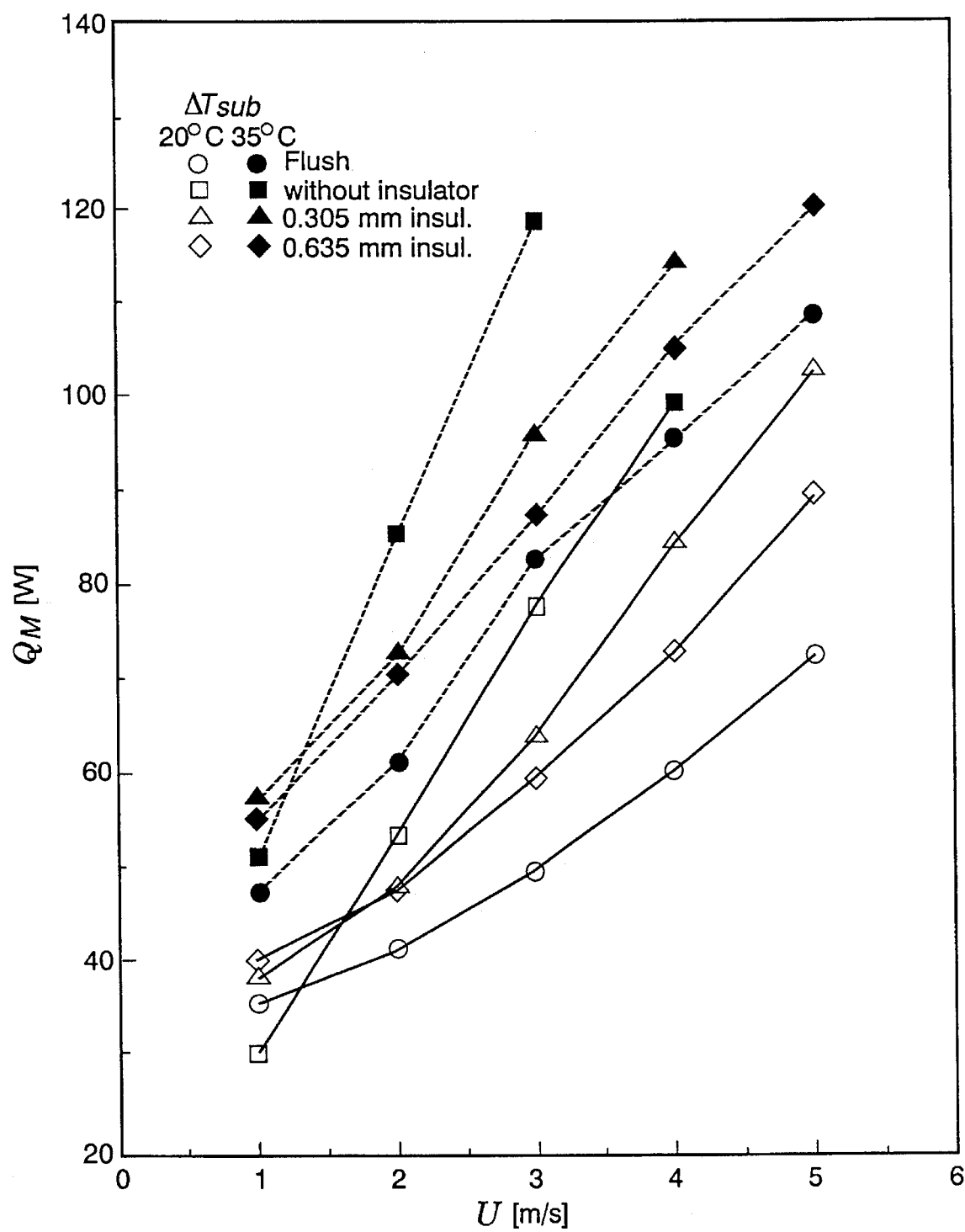
FIG. 9 shows power dissipation capabilities for a cooled element with and without the FIG. 4 and 5 improvements.

FIG. 8 of the drawings shows the effect of the front face insulator 502 in FIG. 5 on the critical heat flux. Together FIGS. 8 and 9 of the drawings illustrate a portion of the advantages achievable with addition of the insulating material of the block 502 to the FIG. 1 cooling environment. In FIG. 8 both 20 and 35 degrees C of subcooling are represented in the data. Insulation thicknesses as shown at 508 in FIG. 5 i.e., 0.305 mm and 0.635 mm are also represented; the same conditions prevail in FIG. 9. FIG. 8 also illustrates that the critical heat flux reduction previously observed at a flow of 1 meter per second is sharply reduced and that heat transfer enhancement for velocities greater than 1 meter per second is not significant. Full coverage of the front face at 109 also yields essentially zero net heat flux gain over the flush condition for subcooling of 20° C., however, increased power dissipation is yet realized. The FIG. 8 and FIG. 9 illustrated opposing effects of the insulators for velocities of 1 meter per second and velocities greater than 1 meter per second is explained by the existence of two different liquid supply mechanisms; for velocities less than 2 meters per second the liquid is fed tangential to the surface—from the upstream edge to the downstream edge and as a result, liquid supplied to the most downstream sites is impeded and critical heat flux is initiated at the most downstream portion of the heated surface. The vapor blanket increases in thickness with part length for this case. For velocities greater than 2 meters per second, the vapor blanket is uniform in thickness and liquid feeds from above. For this reason CHF is much less sensitive to part length at this flow velocity.

Because boiling from the front face 109 creates a vapor blanket which obstructs flow tangential to the top surface, it is understandable how CHF is enhanced by, for example, use of the insulator at 502 in FIG. 5. For velocities greater than 2 meters per second the flow mechanics created by the front face boiling must make a significant contribution to the heat transfer as evidenced by the degradation of CHF with use of the insulators. For example, a reduction of 26 watts occurs by the total elimination of boiling from the face for the case of 20 degrees subcooling and velocity of 4 meters per second. This translates to a heat flux of 430 watts/cm$^2$ if heat transfer from the other surfaces is assumed to remain constant. Since a heat flux in this range appears questionable, the liquid supply mechanism for other surfaces appears to be enhanced by the vapor sheet emanating from the front face 109.

One possibility for this enhancement appears to be that condensing bubbles above the surface draw cool liquid in from the sides to feed the is nucleation sites. The blunt face of the protruding block causes the vapor generated on this face to be projected up. This vapor is outside of the thermal boundary layer and in the presence of cooler liquid where it is more likely to condense.

Power dissipation capability as is represented in the FIG. 9 drawing, is the goal of electronic cooling and indeed, of a heat exchanger in general. Power dissipation is the product of heat flux and area. If CHF increases with heater height as is described herein, the product of heat flux and area or the power dissipation increases at a greater rate, since exposed area also increases. FIG. 9 in the drawings illustrates the dramatic power dissipation increase with velocity for the two herein-considered degrees of subcooling and four conditions of flush, no insulation at 402, and the two insulation heights 404 indicated in the FIG. 9 drawing.

The difference between the filled and hollow symbols curves in FIG. 9 is the degree of subcooling. The significance of this difference is that the relative difference between the flush and non flush cases is greater for 20° C. subcooling than it is for 35° C. subcooling.

The present invention therefore provides for the elimination of undesirable effects that are commonly encountered in the flowing-liquid phase-change cooling of an electronic part or a heat exchanger element. Through the addition of front face boiling and vapor blanket control measures to the cooling environment, stable and predictable as well as more effective heat transfer into the boiling fluid are possible.

While the apparatus and method herein described constitute a preferred embodiment of the invention, it is to be understood that the invention is not limited to this precise form of apparatus or method and that changes may be made therein without departing from the scope of the invention which is defined in the appended claims.

I claim:

1. The method of cooling an electronic part with nucleate boiling in a flowing stream of coolant fluid comprising the steps of:

disposing said electronic part in said flowing stream with a major surface portion thereof extending substantially parallel with said flowing stream and a lesser minor surface portion thereof extending substantially perpendicular to said flowing stream in an upstream-most location of said part;

whereby nucleate boiling of said coolant fluid tends to occur at each of said major and minor surface portions and at any additional coolant exposed surface portions of said electronic part and said nucleate boiling at said upstream-most lesser minor surface portion together with said flowing stream of coolant fluid tends to dispose an undesirable vapor film blanket from said lesser minor surface portion nucleate boiling over said major surface portion of said electronic part; and precluding said undesirable vapor film blanket disposition, to increase and stabilize nucleate boiling cooling of said electronic part major surface portion, by excluding said coolant fluid from boiling contact with a predetermined portion of said lesser minor surface portion of said electronic part.

2. The method of claim 1 wherein said flowing stream of coolant fluid has a velocity above one-half meter per second.

3. The method of claim 1 wherein said excluded from fluid contact predetermined portion of said minor surface portion is at least twenty-five percent of the total area of said minor surface portion of said electronic part.

4. The method of claim 3 wherein said excluding said coolant fluid from contact includes disposing a thermal insulating member over said predetermined portion of said minor surface portion.

5. The method of claim 1 wherein said precluding step also includes removing minor surface boiling generated vapor from a region attending said minor surface prior to its disposition over said major surface portion.

6. Latent heat of vaporization heat transfer apparatus comprising the combination of:

a quantity of vaporizable liquid having stream flow along a supporting substrate member;

a heat source member extending into said liquid stream flow from said supporting substrate member, said heat source member including a first surface region having a component of area extending perpendicular to said stream flow and a larger and downstream of said first surface region second surface region having a component of area extending parallel to said stream flow;

whereby nucleate boiling of said vaporizable liquid tends to occur at each of said heat source first surface and second surface regions; and means for precluding interruption of normal full surface area heat transferring liquid contact with said second surface region by vapor originating in said nucleate boiling at said first surface region and swept over said second surface region by said stream flow.

7. The apparatus of claim 6 wherein said interruption includes one of the physical phenomena of:

decreased contact area between said second surface region and said vaporizable liquid; and time varying area of contact between said second surface region and said vaporizable liquid.

8. The apparatus of claim 6 wherein said second surface region is disposed in one of the physical orientations, with respect to the Earth's gravity vector, of:

horizontal and upward facing;

horizontal and downward facing;

vertical and lateral facing; and inclined and inclusive of components having two of said preceding orientations.

9. The apparatus of claim 8 wherein each of said first and second surface regions and any additional surfaces of said heat source member are configured as one of a planar surface and a curved surface.

10. The apparatus of claim 9 wherein said heat source member comprises a rectangular parallelepiped.

11. The apparatus of claim 9 wherein said heat source member comprises an electronic integrated circuit.

12. The apparatus of claim 9 wherein said heat source member includes a portion thereof that is energized to a differing electrical potential than another vaporizable liquid exposed portion of said apparatus and wherein said vaporizable liquid comprises a dielectric fluid.

13. The apparatus of claim 9 wherein said stream flow has a velocity of at least one-half meter per second.

14. The apparatus of claim 6 wherein said means for precluding includes means for isolating said vaporizable liquid from said heat source member first surface region.

15. The apparatus of claim 7 wherein said means for isolating includes a thermal insulation member covering a predetermined portion of said first surface region.

16. The apparatus of claim 6 wherein said predetermined portion is at least twenty-five percent of the area of said first surface region.

17. Nucleate boiling electronics cooling apparatus comprising the combination of:

a thermal energy dissipating electronic part member having adjoining small and larger external surface portions that are non-coplanar in physical disposition;

a moving stream of nucleate boiling vaporizable coolant fluid;

means for mounting said electronic part within said coolant fluid moving stream with said small surface portion in an upstream-most position and with said moving stream extending along said larger surface portion; and means for limiting the amount of vapor blanket coverage of and cooling fluid isolation of said larger surface portion from boiling vapor generation occurring at said upstream small surface portion in said cooling apparatus.

18. The apparatus of claim 17 wherein said means for limiting includes thermal insulation means located adjacent said small surface portion for both excluding said coolant fluid from predetermined portions of said small surface portion and for presenting a reduced temperature leading edge surface to said moving stream of coolant fluid.

19. The apparatus of claim 18 wherein said means for limiting includes means for displacing vapor from said small surface portion to regions of said moving stream flowing over less than all of said larger external surface.

20. The apparatus of claim 19 wherein said means for displacing vapor includes vapor removal passageways in communicaation with a downstream portion of said stream of coolant fluid.

* * * * *

UNITED STATES PATENT AND TRADEMARK OFFICE
CERTIFICATE OF CORRECTION

PATENT NO. : 5,544,696

DATED: : August 13, 1996

INVENTOR(S) : John E. Leland

It is certified that error appears in the above-identified patent and that said Letters Patent is hereby corrected as shown below:

Column 1, line 39, a hyphen should follow "flow".
Column 2, line 9, "tinned" should read — finned —.
Column 2, line 38, "achieved" should read — surface —. (first occurrence)
Column 2, line 38, a hyphen should follow "invention".
Column 6, line 15, "quanties" should read — quantities —.
Column 7, line 28, the dash should be a period.
Column 7, line 53, "$T^{SAT}$" should read — $T_{SAT}$ —.
Column 9, line 24, the second occurrence of "for" should be deleted.
Column 9, line 37, "i" should read — 1 —.
Column 9, line 60, — total — should be inserted before "power".
Column 12, line 41, "wail" should read — wall —.

Signed and Sealed this

Fourteenth Day of January, 1997

Attest:

BRUCE LEHMAN

*Attesting Officer*  *Commissioner of Patents and Trademarks*